US008860444B2

(12) United States Patent
Lim et al.

(10) Patent No.: US 8,860,444 B2
(45) Date of Patent: Oct. 14, 2014

(54) COMMUNICATION LINE DRIVER PROTECTION CIRCUITRY, SYSTEMS AND METHODS

(75) Inventors: Cheow Guan Lim, Singapore (SG); Fan Yung Ma, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 453 days.

(21) Appl. No.: 13/212,423

(22) Filed: Aug. 18, 2011

(65) Prior Publication Data

US 2013/0043878 A1  Feb. 21, 2013

(51) Int. Cl.
*G01R 27/14* (2006.01)
*H03L 7/00* (2006.01)
*H02H 11/00* (2006.01)
*G01R 31/28* (2006.01)
*H04L 25/02* (2006.01)
*G01R 31/40* (2014.01)
*G01R 19/165* (2006.01)

(52) U.S. Cl.
CPC ............ *G01R 31/2853* (2013.01); *H04L 25/028* (2013.01); *H02H 11/006* (2013.01); *G01R 31/40* (2013.01); *G01R 19/16576* (2013.01)
USPC .......................... 324/705; 324/713; 327/142

(58) Field of Classification Search
USPC .................. 324/705, 707, 713; 327/142, 143
See application file for complete search history.

(56) References Cited

U.S. PATENT DOCUMENTS

2008/0079467 A1* 4/2008 Hou .............................. 327/143

* cited by examiner

*Primary Examiner* — Vincent Q Nguyen
(74) *Attorney, Agent, or Firm* — Patterson Thuente Pedersen, P.A.

(57) ABSTRACT

Embodiments relate to fault detection comparator circuitry and methods that can operate in conjunction with a power-on-reset (POR) scheme to put a chip into a reliable power-down mode upon fault detection to avoid disrupting the communication bus link such that other connected chips and the host can continue to operate. Power-on of the affected chip can then be carried out when the connection with that chip is restored.

12 Claims, 5 Drawing Sheets

| VDD | VSSP | PAD | (NOT A) x B | COMMENTS |
|---|---|---|---|---|
| OK | OK | 0, 1 | 1 | NORMAL OPERATION DETECTED |
| NOT OK | OK | 0 | 1 (FOLLOWING VDD) | NO FAULT DETECTED |
| NOT OK | OK | 1 | 0 | FAULT DETECTED |
| OK | NOT OK | 0 | 0 (FOLLOWING VSSP) | FAULT DETECTED |
| OK | NOT OK | 1 | 1 | NO FAULT DETECTED |
| NOT OK | NOT OK | 0 | 0 (FOLLOWING VSSP) | FAULT DETECTED |
| NOT OK | NOT OK | 1 | 0 (FOLLOWING VSSP) | FAULT DETECTED |

COMMUNICATION LINE DRIVER PROTECTION CIRCUITRY, SYSTEMS AND METHODS

TECHNICAL FIELD

The invention relates generally to communication systems and more particularly to communication line driver protection systems and methods.

BACKGROUND

In bidirectional communication lines, if either the supply voltage or ground is disconnected while a device is driving a communication line, the device potentially can stay in an active state. This results in a fault condition. A secondary power path via signaling pins enables continued operation, but this can consume high currents and risks bringing down all communications. Additionally, oscillation between high and low loading on the host signal pad can ensue, damaging pad circuitry. A worst-case scenario can occur if a fault occurs in a system in which multiple devices are connected to the communication line.

Conventional solutions apply capacitor filtering on the voltage supply line to filter oscillation, but during a supply disconnect fault condition there is no direct current supply for the device, with only the capacitor to supply current. Applications are therefore limited based on how much current the capacitor can provide before device overloading is triggered. Further, the capacitor requires additional area, which is typically at a premium.

Therefore, there is a need for improved communication line driver protection systems and methods.

SUMMARY

Embodiments relate to circuitry, systems and methods for fault detection.

In an embodiment, a method comprises detecting a loss of voltage to a device by comparing a signal pad voltage with a supply voltage and ground; disabling power-on-reset circuitry of the device and preventing the device from attempting to power on; detecting a restoration of voltage to the device; and powering on the device.

In an embodiment, a fault detection circuit for a chip comprises a first comparator coupled between a signal pad and a supply voltage; a second comparator coupled between the signal pad and ground; bandgap reference circuitry; power-on-reset circuitry; and logic circuitry coupled to outputs of the first and second comparators and to the bandgap reference circuitry and power-on-reset circuitry and configured to detect a fault in at least one of the supply voltage or ground and prevent the chip from powering on.

BRIEF DESCRIPTION OF THE DRAWINGS

The invention may be more completely understood in consideration of the following detailed description of various embodiments of the invention in connection with the accompanying drawings, in which.

Figure 1:
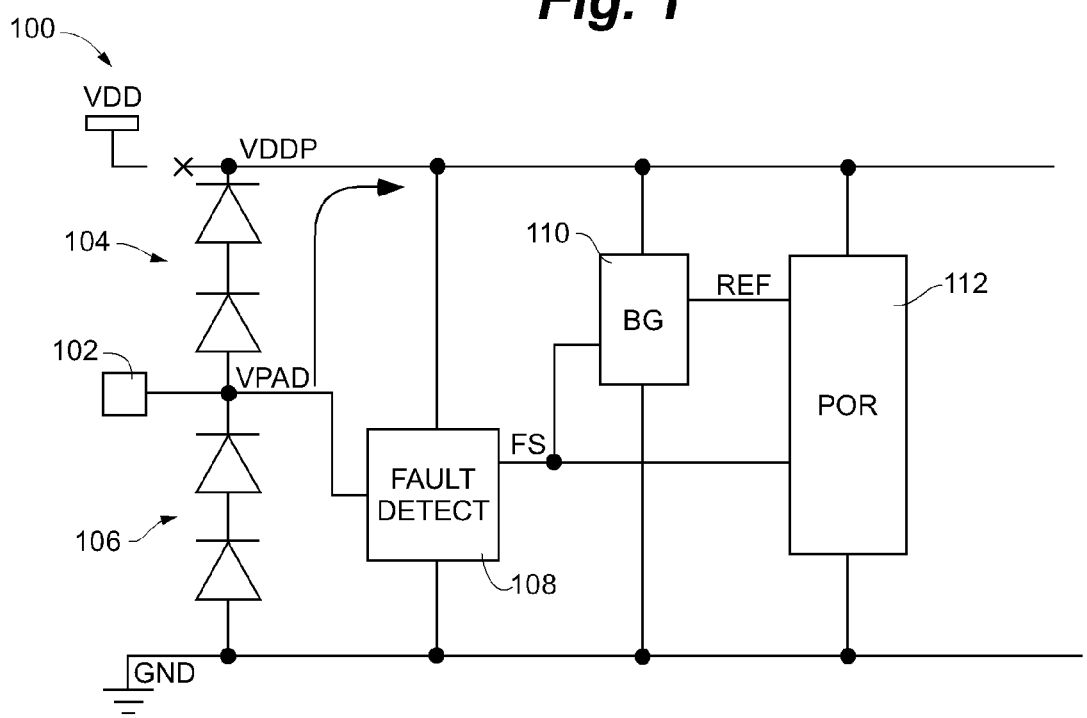
FIG. 1 is a block diagram of fault detection circuitry according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to fault detection comparator circuitry and methods that can operate in conjunction with a power-on-reset (POR) scheme to put a chip into a reliable power-down mode upon fault detection to avoid disrupting the communication bus link such that other connected chips and the host can continue to operate. Power-on of the affected chip can then be carried out when the connection with that chip is restored.

Referring to FIG. 1, a circuit block diagram is depicted. Circuit 100 comprises a signal pad 102 having a voltage Vpad, and two sets of diodes 104 and 106. Signal pad 102 is coupled to fault detection circuitry 108, which is in turn coupled to bandgap reference circuitry 110 and power-on-reset (POR) circuitry 112.

Signal pad 102 can be coupled to a communication line or bus, and the communication line can be shared with other chips. In operation, if Vdd for chip 100 is lost, supply voltage can be pulled from supply pad 102 (shown by arrow in FIG. 1), leading to the aforementioned undesired current drain and possibly affecting the operation of other chips coupled to the communication line. In circuit 100, fault detection circuitry 108 compares Vpad with Vddp, and Vpad with ground (Gnd), to detect a disconnect, or loss of Vdd or Gnd. If a disconnect is detected, fault detection circuitry 108 disables bandgap reference circuitry 110 and power-on-reset block 112 to avoid a power-up, power down oscillation, and chip 100 is powered down. An internal Vddp-to-ground passive resistance sustains a minimum current needed for fault detection circuitry 108 and other components to function until full connection is restored, and is included within bandgap reference circuitry 110. When Vdd is restored and detected by fault detection circuitry 108, the power-down is released and chip 100 is powered-up in a normal manner.

Figure 2A:
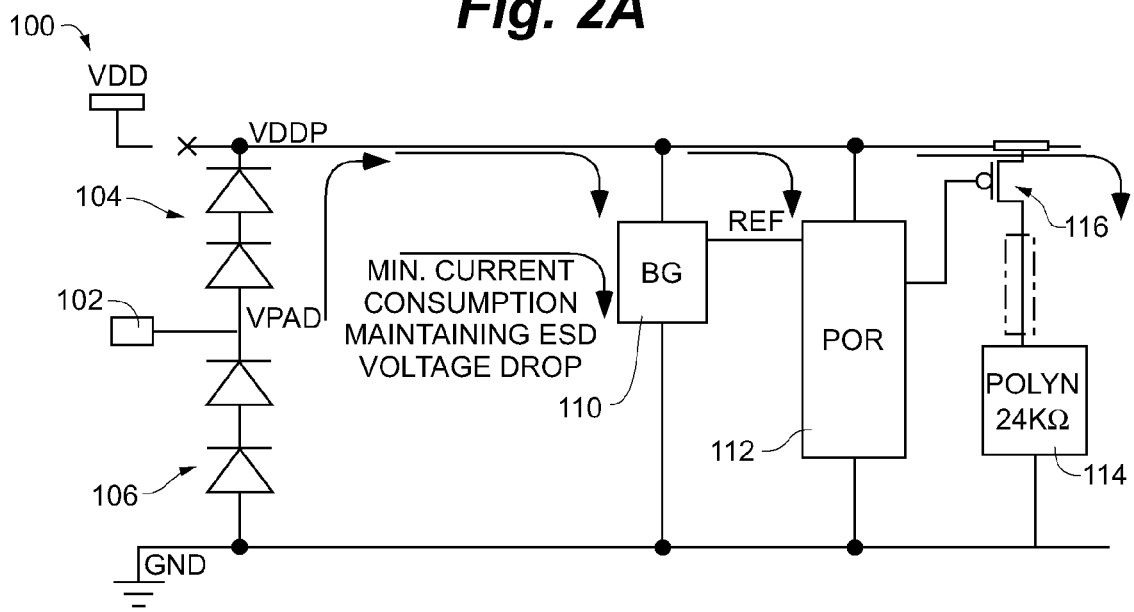
FIG. 2A is a block diagram of fault detection circuitry according to an embodiment.
Figure 2B:
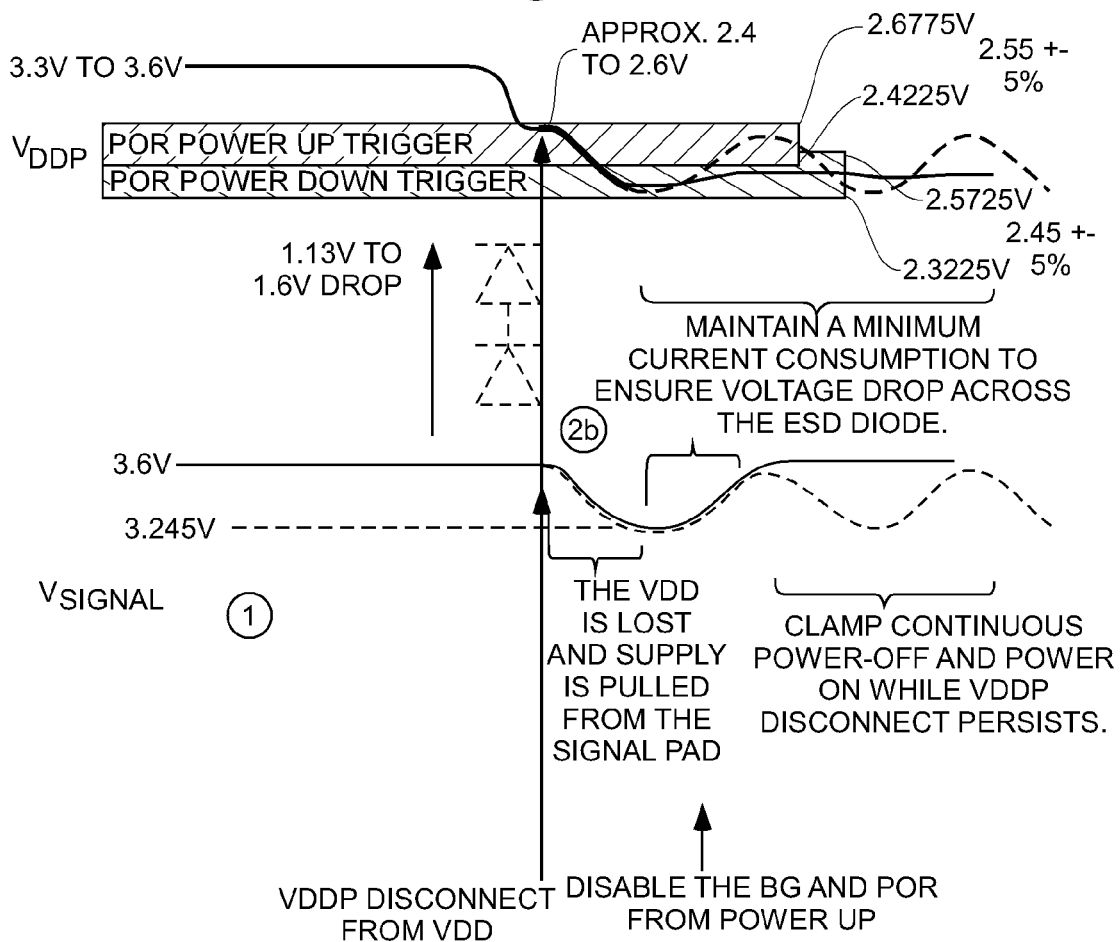
FIG. 2B is a functional diagram of the fault detection circuitry of FIG. 2A.

Another embodiment is depicted in FIG. 2A, in which a PolyN resistor 114 is included in circuit block 100 and fault detection circuitry is implemented within signal pad 102. PolyN resistor 114 functions as a pull-down or small current draw to provide a memory effect to fault detection circuitry implemented in pad 102 and to improve fault detection consistency. Resistor 114 can be selected and sized to enable N devices having fault detection circuitry to share a communication line without damaging the host pad, where N is the host signal pad maximum current for VOH divided by the current through resistor 114. Communications can thus be maintained with others of the N devices if a fault occurs in one or more. Resistor 114 can also be configured to provide a current sink to enable the host to detect a fault by checking a line current. Refer, for example, to FIG. 2B, which includes example voltages.

In embodiments, resistor 114 can be a selectively programmable PolyN pull-down configuration. In the embodiment depicted in FIG. 2A, resistor 114 is about 24 kilo-Ohms (kΩ) and a current therethrough is about 200 μA for current design requirements to allow about ten chips to fault, consuming in total about 2 mA of current. The size and/or configuration of resistor 114 can vary in other embodiments.

Figure 3:
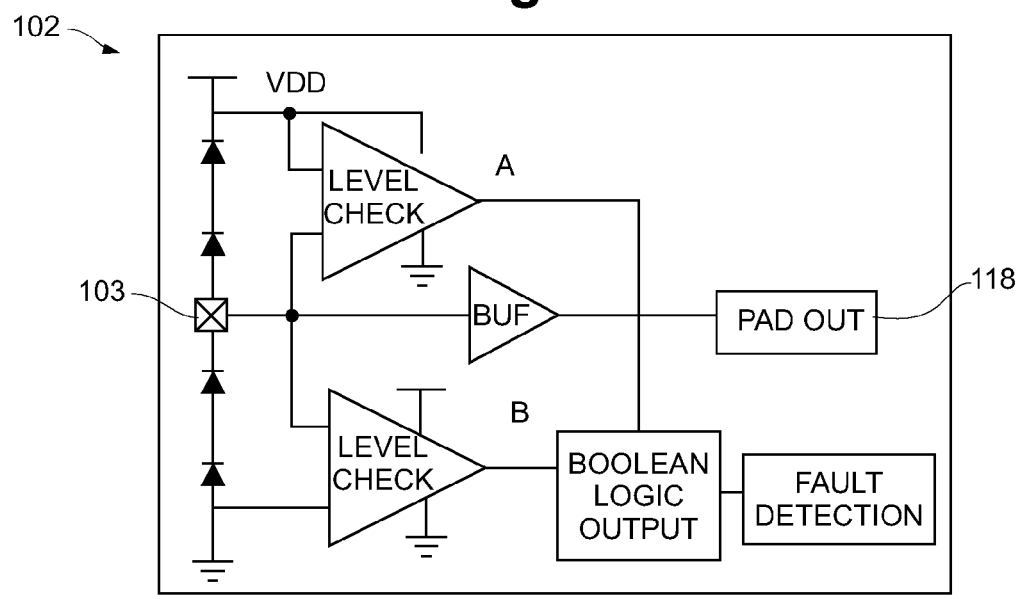
FIG. 3 is a block diagram of signal pad circuitry comprising fault detection circuitry according to an embodiment.
Figure 4:
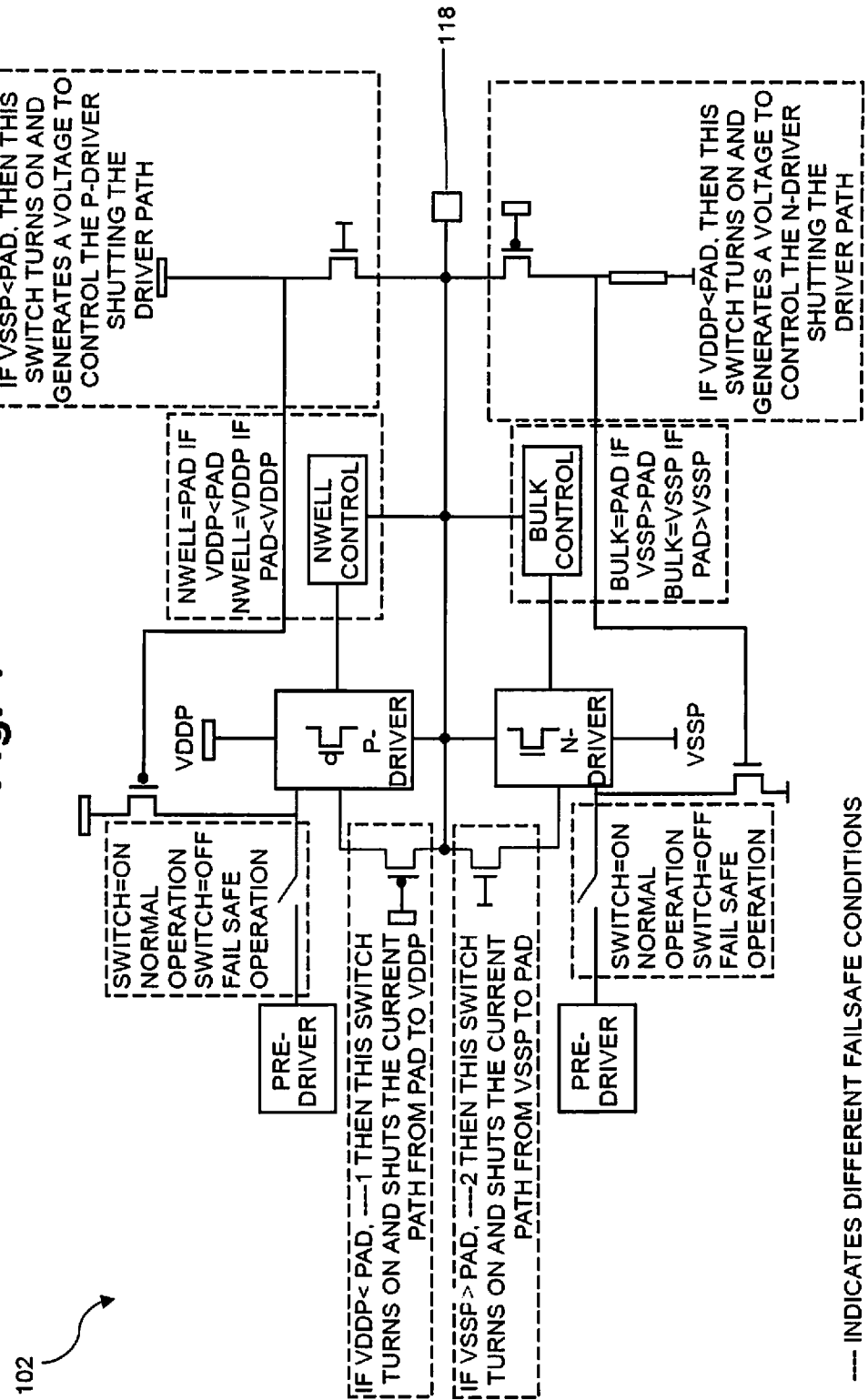
FIG. 4 is a block diagram of fault detection circuitry according to an embodiment.
Figures 5, 6:
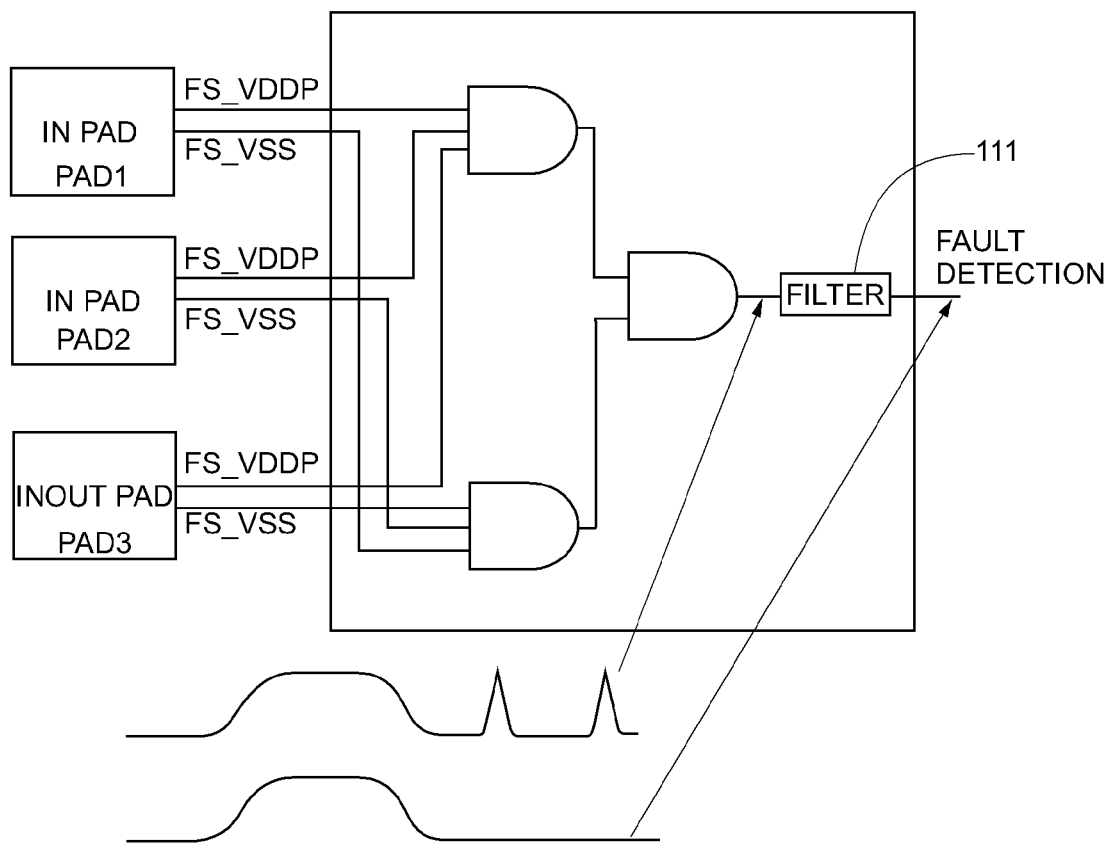
FIG. 5 is a fault detection logic table according to an embodiment.
FIG. 6 is block diagram of fault detection circuitry according to an embodiment.

Fault detection circuitry as implemented in pad 102 in an embodiment is shown in more detail in FIG. 3. In other embodiments, such as the embodiment of FIG. 1, circuitry the same or similar to that depicted in FIG. 3 can be implemented in or as fault detection circuitry 108. The circuitry of pad 102 includes a signal pad coupling point 103 and carries out a comparison of the voltage at coupling point 103 with Vdd and ground. FIG. 4 is another depiction of detection circuitry in pad 102 and includes output pad 118 according to an embodiment. FIG. 6 depicts logic combining the detection of a supply or ground disconnects to control the power-on-reset to trigger power-down upon fault detection.

The related Boolean logic is shown in FIG. 5. According to FIG. 5, faults were detected in four instances, two in which Vdd was lost or "not OK" and pad 103 was at logic "1," and two in which Gnd was lost or "not OK" and 103 was at logic "0."

The fault detection circuitry and concept can be extended to any number of pads and/or any number of supply and ground signals. Referring to FIG. 6, three pads Pad1, Pad2 and Pad3 are depicted. The logical "AND" shows one possibility, according to an embodiment, for combining fault detection for all pads and control of the power-on-reset through a filter 111.

Embodiments thereby prevent power-up and power-down oscillation during fault events, such as the disconnection of supply voltage and/or ground, by incorporating fault detection circuitry, while preventing the communication line from becoming overloaded with chips experiencing faults such that other chips on the communication line can remain operational. In embodiments, the fault detection circuitry is implemented in each signal pad. Each signal pad can be supplied by a low-current path such that the current budget for a maximum number of chips at fault can remain within the host driver's current capability. The fault detection circuitry detects the line voltage relative to both supply, Vdd, and ground, providing a faster response time than conventional detection via power-on-reset mechanisms. In operation, the fault detection circuitry powers down the chip when supply and/or ground disconnect conditions are detected and powers up the chip when a new connection is established and detected.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A fault detection circuit for a chip, comprising:
   a first comparator coupled between a signal pad and a supply voltage;
   a second comparator coupled between the signal pad and ground;
   bandgap reference circuitry;
   power-on-reset circuitry; and
   logic circuitry coupled to outputs of the first and second comparators and to the bandgap reference circuitry and power-on-reset circuitry and configured to detect a fault in at least one of the supply voltage or ground and prevent the chip from powering on.

2. The fault detection circuit of claim 1, wherein the fault detection circuit is implemented in circuitry coupled to the signal pad.

3. The fault detection circuit of claim 1, wherein the logic circuitry is configured to prevent the chip from powering on by disabling the bandgap reference circuitry and the power-on-reset circuitry.

4. The fault detection circuit of claim 1, wherein the logic circuitry is configured to detect a resolution of the fault and enable the chip to power on.

5. The fault detection circuit of claim 1, further comprising a pull-down resistor.

6. The fault detection circuit of claim 5, wherein the resistor is configured to maintain a current flow via the signal pad coupled to the fault detection circuit.

7. The fault detection circuit of claim 6, wherein the resistor is sized to allow N devices comprising the fault detection circuit to share a communication line without overloading a host pad if a fault occurs.

8. The fault detection circuit of claim 7, wherein the fault detection circuit is configured to maintain communications with others of the N devices if one or more of the N devices has a fault.

9. The fault detection circuit of claim 5, wherein the resistor is configured as a current sink to enable a host to detect a fault by checking a line current.

10. The fault detection circuit of claim 9, wherein the resistor is coupled with a communication line.

11. The fault detection circuit of claim 5, wherein the resistor is selectively programmable between a pull-down resistor configuration and a current sink configuration.

12. The fault detection circuit of claim 1, wherein the bandgap reference circuitry and the power-on-reset circuitry are coupled to a plurality of signal pads.

\* \* \* \* \*

UNITED STATES PATENT AND TRADEMARK OFFICE
CERTIFICATE OF CORRECTION

| | | |
|---|---|---|
| PATENT NO. | : 8,860,444 B2 | Page 1 of 1 |
| APPLICATION NO. | : 13/212423 | |
| DATED | : October 14, 2014 | |
| INVENTOR(S) | : Lim et al. | |

It is certified that error appears in the above-identified patent and that said Letters Patent is hereby corrected as shown below:

In the Specification

Column 3, line 1-2, immediately after the sentence that ends "fault by checking a line current.":
Insert -- A transistor switch 116 to enable or disable resistor 114 function is included. --

Signed and Sealed this
Twenty-fourth Day of March, 2015

Michelle K. Lee
*Director of the United States Patent and Trademark Office*